United States Patent
Lee

(10) Patent No.: US 8,742,805 B2
(45) Date of Patent: Jun. 3, 2014

(54) POWER ON RESET DEVICE AND POWER ON RESET METHOD

(71) Applicant: Samsung Electro-Mechanics Co., Ltd., Gyeonggi-do (KR)

(72) Inventor: Soo Woong Lee, Gyeonggi-do (KR)

(73) Assignee: Samsung Electro-Mechanics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/706,608

(22) Filed: Dec. 6, 2012

(65) Prior Publication Data

US 2014/0028360 A1    Jan. 30, 2014

(30) Foreign Application Priority Data

Jul. 26, 2012  (KR) .................. 10-2012-0081905

(51) Int. Cl.
*H03L 7/00* (2006.01)
(52) U.S. Cl.
USPC .................. 327/143; 327/142; 327/198
(58) Field of Classification Search
USPC .............. 327/142, 143, 198, 530–546; 323/312–317
See application file for complete search history.

(56) References Cited

U.S. PATENT DOCUMENTS

| | | | |
|---|---|---|---|
| 6,456,086 B1* | 9/2002 | Bolz et al. | 324/522 |
| 6,600,328 B2* | 7/2003 | Ku | 324/678 |
| 7,259,597 B2* | 8/2007 | Wu | 327/78 |
| 7,639,052 B2* | 12/2009 | Xiao et al. | 327/143 |
| 7,751,247 B2* | 7/2010 | Lee | 365/185.2 |
| 8,310,286 B2* | 11/2012 | Chen et al. | 327/143 |
| 8,487,673 B2* | 7/2013 | Xiao et al. | 327/143 |
| 8,531,194 B2* | 9/2013 | Edwards | 324/713 |
| 2002/0101263 A1* | 8/2002 | Kinoshita et al. | 327/58 |
| 2007/0001720 A1* | 1/2007 | Li et al. | 327/143 |
| 2008/0123403 A1* | 5/2008 | Lee | 365/185.2 |

FOREIGN PATENT DOCUMENTS

| | | |
|---|---|---|
| JP | 09-305421 | 11/1997 |
| JP | 2002-170391 | 6/2002 |
| JP | 2005-148827 | 6/2005 |
| KR | 10-2000-0023209 A | 4/2000 |
| KR | 10-2001-0082073 A | 8/2001 |
| KR | 1020070013417 | 1/2007 |

* cited by examiner

*Primary Examiner* — Brandon S Cole

(74) *Attorney, Agent, or Firm* — Bracewell & Giuliani LLP; Brad Y. Chin

(57) ABSTRACT

Disclosed herein are a power on reset device capable of performing a precise brown out detection (BOD) function and a power on reset method using the same. The power on reset device may include a delay signal generating unit, a reference voltage generating unit, and a reset signal generating comparing a delay signal with a reference voltage to generate a reset signal.

13 Claims, 4 Drawing Sheets

120

130

130-1

130-2

POWER ON RESET DEVICE AND POWER ON RESET METHOD

CROSS REFERENCE(S) TO RELATED APPLICATIONS

This application claims the benefit under 35 U.S.C. Section 119 of Korean Patent Application Serial No. 10-2012-0081905, entitled "Power On Reset Device and Power On Reset Method" filed on Jul. 26, 2012, which is hereby incorporated by reference in its entirety into this application.

BACKGROUND OF THE INVENTION

1. Technical Field

The present invention relates to a power on reset (POR) device and a POR method.

2. Description of the Related Art

Power on reset (POR) means that a digital register, or the like, is reset after a predetermined time from a point in time at which power starts to be supplied at the time of initial driving of an electronic apparatus to allow a system to be stably operated.

Further, in addition to the initial driving of the electronic device, in the case in which the supply of power becomes unstable due to various reasons, the digital register, or the like, is reset in order to protect the electronic apparatus and prevent a malfunction.

The temporal power down phenomenon as described above is called a brown out phenomenon, and an operation of detecting and coping with the brown out phenomenon is called a brown out detection (BOD).

Meanwhile, according to the related art, a circuit performing the POR and a circuit performing the BOD are generally provided, respectively. Therefore, there is a limitation in satisfying requirements such as miniaturization, slimness, and lightness of the electronic apparatus.

In addition, in the scheme of performing the BOD according to the related art, a reference voltage for detecting a brown out situation has been mainly provided in software and comparison between a power supply voltage and the reference voltage has also been mainly implemented in software. However, in the case of applying the software control scheme as described above, as the power supply voltage is unstable, it is likely that a controlling unit will malfunction, such that there is a limitation in securing stable operation reliability of the electronic apparatus.

In addition, in some case, a threshold voltage of a metal oxide semiconductor field effect transistor (MOSFET) has been used as the reference voltage for the BOD. However, since a deviation of the threshold voltage of the MOSFET according to a manufacturing process of the MOSFET or a temperature of an apparatus is large, accuracy in performing the BOD becomes low and a separate temperature compensation circuit for compensating for the low accuracy, or the like, should be included.

RELATED ART DOCUMENT

Patent Document
(Patent Document 1) Korean Patent Laid-Open Publication No. 2001-0082073
(Patent Document 2) Korean Patent Laid-Open Publication No. 2000-0023209

SUMMARY OF THE INVENTION

An object of the present invention is to provide a power on reset device capable of performing a precise brown out detection (BOD) function.

Another object of the present invention is to provide a power on reset device capable of performing a power on reset function optimized according to a use condition of an apparatus by allowing a reference voltage that becomes a reference of BOD to be changed.

Still another object of the present invention is to provide a power on reset method capable of performing a precise BOD function.

Still another object of the present invention is to provide a power on reset method capable of performing a power on reset function optimized according to a use condition of an apparatus by allowing a reference voltage that becomes a reference of BOD to be changed.

According to an exemplary embodiment of the present invention, there is provided a power on reset device including: a power supply unit providing a power supply voltage; a delay signal generating unit delaying and outputting the power supply voltage provided from the power supply unit by a predetermined time; and a reset signal generating unit comparing a signal output from the delay signal generating unit with a predetermined reference voltage to generate a reset signal.

The reset signal generating unit may generate the reset signal in the case in which the signal output from the delay signal generating unit is smaller than the reference voltage.

The reset signal generating unit may include a first comparator having a first terminal to which the signal output from the delay signal generating unit is input and a second terminal to which the reference signal is applied.

The reset signal generating unit may further include an inverter connected to an output terminal of the first comparator, the first terminal of the first comparator may be a non-inverting terminal, and the second terminal of the first comparator may be an inverting terminal.

The power supply unit may include: an external power input terminal to which external power is input; and a regulator regulating the external power input through the external power input terminal.

The delay signal generating unit may include: a first capacitor having the power supply voltage applied to one end thereof; a first node connected to the other end of the first capacitor; a first transistor having a first terminal connected to the first node and a second terminal connected to a ground; a second transistor having a first terminal connected to one end of the first capacitor and a control terminal connected to the first node; a second node connected to a control terminal of the first transistor and a second terminal of the second transistor; and a second capacitor having one end connected to the second node and the other end connected to the ground, and the delay signal generating unit may output a voltage value of the second capacitor.

According to another exemplary embodiment of the present invention, there is provided a power on reset device including: a power supply unit providing a power supply voltage; a delay signal generating unit delaying and outputting the power supply voltage provided from the power supply unit by a predetermined time; a reference voltage generating unit generating a reference voltage; and a reset signal generating unit comparing a signal output from the delay signal generating unit with the reference voltage to generate a reset signal.

The reference voltage generating unit may include: a third transistor having the power supply voltage applied to a first terminal thereof; a first resistor unit having one end connected to a second terminal of the third transistor; a second resistor unit having one end connected to the other end of the first resistor unit and the other end connected to a ground; and a second comparator having a first terminal connected to the other end of the first resistor unit, a second terminal to which a common mode voltage (VCM) is applied, and an output terminal connected to a control terminal of the third transistor, and the reference voltage generating unit has an output terminal connected to the second terminal of the third transistor.

The first resistor unit may be a variable resistor.

The first resistor unit may include: a first resistor having one end connected to the second terminal of the third transistor; a first switch having one end connected to the other end of the first resistor and the other end provided at one end of the second resistor unit to thereby be turned on or turned off; a second resistor having one end connected to the second terminal of the third transistor; and a second switch having one end connected to the other end of the second resistor and the other end provided at one end of the second resistor unit to thereby be turned on or turned off, and the first resistor unit may have a resistance value varied by a turn on or turn off operation of the first and second switches.

According to still another exemplary embodiment of the present invention, there is provided a power on reset method including: providing a power supply voltage; generating a delay signal by delaying the power supply voltage by a predetermined time; and comparing the delay signal with a predetermined reference voltage to output a reset signal that is H only in the case in which the delay signal is smaller than the reference voltage and that is L in other cases.

According to still another exemplary embodiment of the present invention, there is provided a power on reset method including: providing a power supply voltage; generating a delay signal by delaying the power supply voltage by a predetermined time; generating a reference voltage; and comparing the delay signal with the reference voltage to output a reset signal that is H only in the case in which the delay signal is smaller than the reference voltage and that is L in other cases.

In the generating of the reference voltage, the reference voltage may be generated by dividing the power supply voltage in a predetermined ratio and not be output in the case in which the power supply voltage is changed in excess of a predetermined range.

The predetermined ratio may be varied.

BRIEF DESCRIPTION OF THE DRAWINGS

FIGS. 7A and 7B are diagrams schematically showing a relationship between input and output signals of the power on reset device according to the exemplary embodiment of the present invention, wherein FIG. 7A is a graph showing a waveform of a delay signal Vd output in a delay signal generating unit; and FIG. 7B is a graph showing a reset signal Vr output to a reset signal output terminal.

DESCRIPTION OF THE PREFERRED EMBODIMENTS

Figure 1:
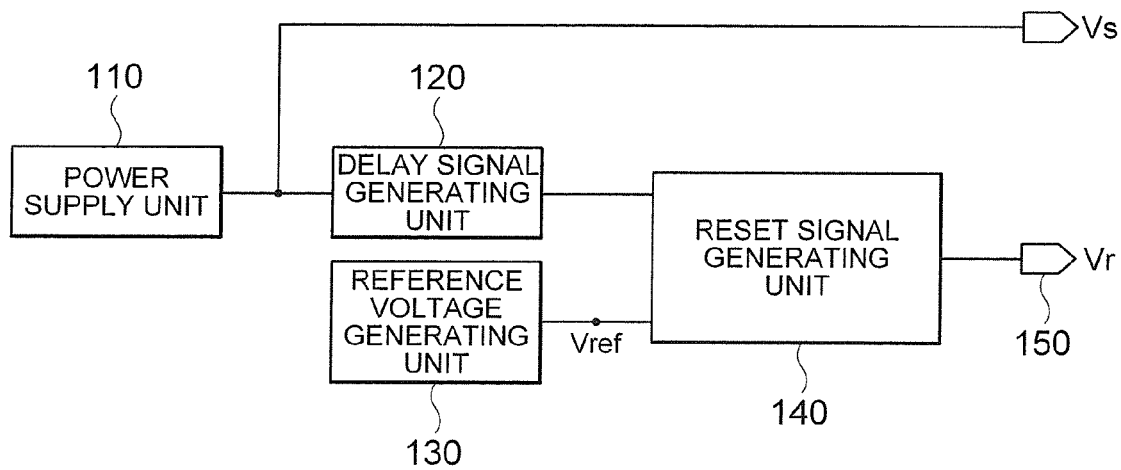
FIG. 1 is a block diagram schematically showing a power on reset device according to an exemplary embodiment of the present invention.

Various advantages and features of the present invention and methods accomplishing thereof will become apparent from the following description of exemplary embodiments with reference to the accompanying drawings. However, the present invention may be modified in many different forms and it should not be limited to exemplary embodiments set forth herein. These exemplary embodiments may be provided so that this disclosure will be thorough and complete, and will fully convey the scope of the invention to those skilled in the art. Like reference numerals throughout the description denote like elements.

Terms used in the present specification are for explaining exemplary embodiments rather than limiting the present invention. Unless explicitly described to the contrary, a singular form includes a plural form in the present specification. The word "comprise" and variations such as "comprises" or "comprising," will be understood to imply the inclusion of stated constituents, steps, operations and/or elements but not the exclusion of any other constituents, steps, operations and/or elements.

For simplification and clearness of illustration, a general configuration scheme will be shown in the accompanying drawings, and a detailed description of the feature and the technology well known in the art will be omitted in order to prevent a discussion of exemplary embodiments of the present invention from being unnecessarily obscure. Additionally, components shown in the accompanying drawings are not necessarily shown to scale. For example, size of some components shown in the accompanying drawings may be exaggerated as compared with other components in order to assist in understanding of exemplary embodiments of the present invention. Like reference numerals on different drawings will denote like components, and similar reference numerals on different drawings will denote similar components, but are not necessarily limited thereto.

In the specification and the claims, terms such as "first", "second", "third", "fourth" and the like, if any, will be used to distinguish similar components from each other and be used to describe a specific sequence or a generation sequence, but is not necessarily limited thereto. It may be understood that these terms are compatible with each other under an appropriate environment so that exemplary embodiments of the present invention to be described below may be operated in a sequence different from a sequence shown or described herein. Likewise, in the present specification, in the case in which it is described that a method includes a series of steps, a sequence of these steps suggested herein it not necessarily a sequence in which these steps may be executed. That is, any described step may be omitted and/or any other step that is not described herein may be added to the method.

In the specification and the claims, terms such as "left", "right", "front", "rear", "top, "bottom", "over", "under", and the like, if any, are not necessarily to indicate relative positions that are not changed, but are used for description. It may be understood that these terms are compatible with each other under an appropriate environment so that exemplary embodiments of the present invention to be described below may be operated in a direction different from a direction shown or described herein. A term "connected" used herein is defined as being directly or indirectly connected in an electrical or non-electrical scheme. Targets described as being "adjacent to" each other may physically contact each other, be close to each other, or be in the same general range or region, in the context in which the above phrase is used. Here, a phrase "in an exemplary embodiment" means the same exemplary embodiment, but is not necessarily limited thereto.

Hereinafter, a configuration and an acting effect of exemplary embodiments of the present invention will be described in more detail with reference to the accompanying drawings.

Figure 2:
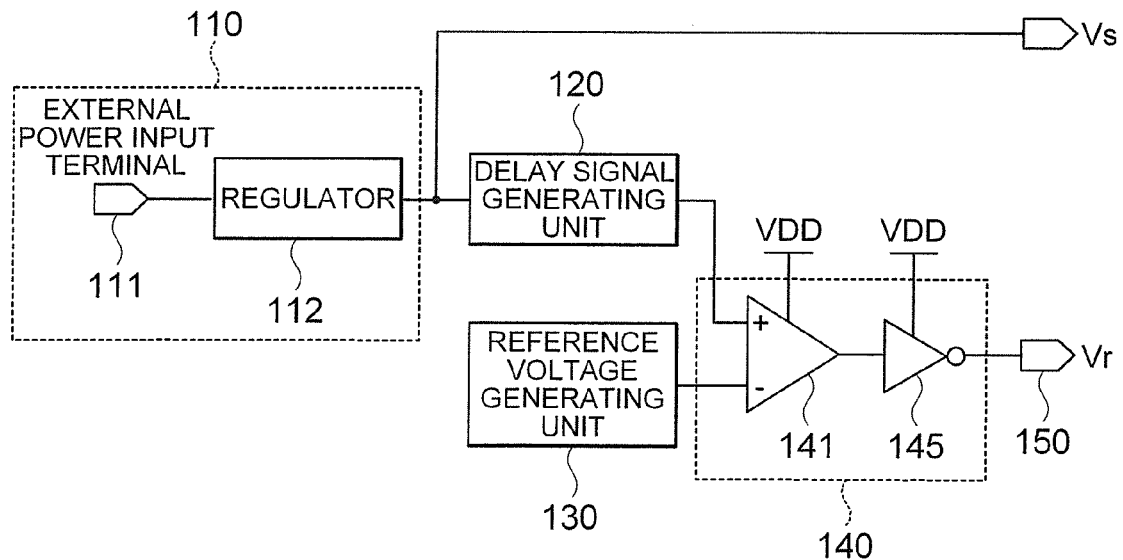
FIG. 2 is a diagram schematically showing the power on reset device according to the exemplary embodiment of the present invention.
Figure 3:
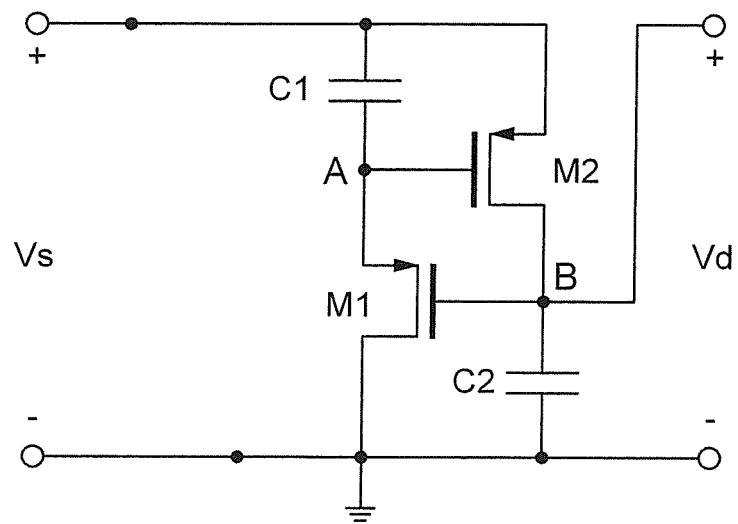
FIG. 3 is a diagram schematically showing a delay signal generating unit of the power on reset device according to the exemplary embodiment of the present invention.

FIG. 1 is a block diagram schematically showing a power on reset device 100 according to an exemplary embodiment of the present invention; FIG. 2 is a diagram schematically showing the power on reset device 100 according to the exemplary embodiment of the present invention; and FIG. 3 is a diagram schematically showing a delay signal generating unit 120 of the power on reset device 100 according to the exemplary embodiment of the present invention.

Referring to FIGS. 1 and 2, the power on reset device 100 according to the exemplary embodiment of the present invention may be configured to include a power supply unit 110, a delay signal generating unit 120, and a reset signal generating unit 140.

First, the power supply unit 110 serves to provide a power supply voltage Vs.

Here, the power supply unit 110 may include an external power input terminal 111 to which external power is applied. Further, the power supply unit 110 may include a regulator 112 to regulate the external power and supply the regulated power to the device.

Next, the delay signal generating unit 120 receives the power supply voltage Vs supplied through the power supply unit 110 and delays and outputs the power supply voltage Vs by a predetermined time.

As described above, most of the electronic apparatuses include a controlling unit, a memory unit, and the like. However, in the early stage in which power starts to be supplied to the electronic apparatus, such that the electronic apparatus starts to be driven, the power supply voltage Vs is unstable, and the controlling unit, the memory unit, or the like, malfunctions in this unstable power supply voltage Vs environment. Therefore, a reset signal Vr allowing the controlling unit or the memory unit to be reset after the power supply voltage Vs is stabilized is provided.

A function of providing the reset signal Vr is performed by a power on reset circuit. Therefore, the power supply voltage Vs is delayed at a predetermined time interval so that the reset signal Vr in which a waveform of the power supply voltage Vs is reflected may be generated after waiting until the power supply voltage Vs supplied to the apparatus is stabilized.

Further, even in the case in which a phenomenon that the power supply voltage Vs is temporally down, that is, a brown out phenomenon is generated, the power supply voltage Vs is also delayed at a predetermined time interval.

The signal delayed through the delay signal generating unit 120 as described above is provided to the reset signal generating unit 140 and is compared with a reference voltage Vref, such that the reset signal Vr may be generated.

Referring to FIG. 2, the reset signal generating unit 140 may include a first comparator 141 and an inverter 145.

The signal output from the delay signal generating unit 120 may be applied to a non-inverting terminal of the first comparator 141, and the reference voltage Vref may be applied to an inverting terminal of the first comparator 141.

Therefore, when the signal generated by delaying the power supply voltage Vs is higher than the reference voltage Vref, an H signal is output from the first comparator 141, and when the signal generated by delaying the power supply voltage Vs is lower than the reference voltage Vref, an L signal is output from the first comparator 141. In addition, the output signal is inverted through the inverter 145 connected to an output terminal of the first comparator 141.

Therefore, at normal times, a signal output through a reset signal Vr output terminal 150 is maintained in an L state. Then, when the power supply voltage Vs becomes lower than the reference voltage Vref, the H signal is output through the reset signal Vr output terminal 150 after being delayed by a predetermined time, such that the controlling unit, the memory unit, or the like, may be reset.

Meanwhile, the reference voltage Vref may be provided as a predetermined value to the reset signal generating unit 140.

FIG. 3 is a diagram schematically showing a delay signal generating unit 120 of the power on reset device 100 according to the exemplary embodiment of the present invention.

Referring to FIG. 3, the delay signal generating unit 120 may include two capacitors C1 and C2 and two transistors M1 and M2.

The first capacitor C1 has one end to which the power supply voltage Vs is applied and the other end connected to a first node A.

The first transistor M1 has a first terminal connected to the first node A and a second terminal connected to a ground.

The second transistor M2 has a first terminal connected to one end of the first capacitor C1 and a second terminal connected to a second node B.

The second capacitor C2 has one end connected to the second node B and the other end connected to the ground.

Here, a control terminal of the first transistor M1 is connected to the second node B, and a control terminal of the second transistor M2 is connected to the first node A.

In addition, a voltage across the second voltage C2 becomes a delay signal Vd, which is an output signal of the delay signal generating unit 120.

Hereinafter, an operation of the delay signal generating unit 120 configured as described above will be described in detail.

First, when the power supply voltage Vs increases, a voltage of the first capacitor C1 linearly increases, such that a voltage $V_A$ at the first node A linearly increases in the ratio similar to an increase ratio in the power supply voltage Vs.

Then, when the first transistor M1 is turned on, the voltage $V_A$ at the first node A increases in a state in which an increase ratio thereof decreases, such that a difference between the voltage $V_A$ at the first node A and the power supply voltage Vs becomes large.

Thereafter, when the difference between the voltage $V_A$ at the first node A and the power supply voltage Vs becomes larger than a threshold voltage of the second transistor M2, the second transistor M2 is turned on, such that a voltage $V_B$ at the second node B linearly increases.

Therefore, the waveform of the power supply voltage Vs is delayed by a predetermined time, such that the delay signal Vd may be output to the second node B.

Figure 4:
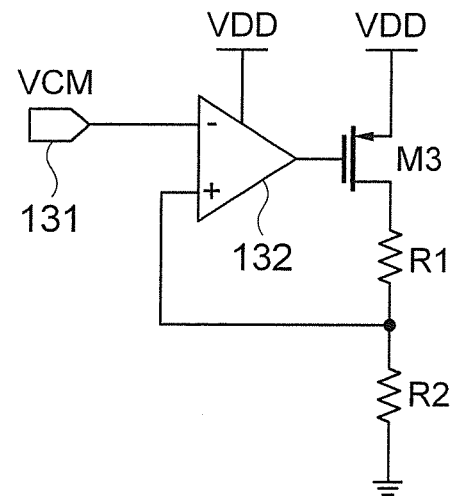
FIG. 4 is a diagram schematically showing a reference voltage generating unit of the power on reset device according to the exemplary embodiment of the present invention.

FIG. 4 is a diagram schematically showing a reference voltage generating unit 130 of the power on reset device 100 according to the exemplary embodiment of the present invention.

Referring to FIG. 4, the reference voltage generating unit 130 may include a third transistor M3, a first resistor unit R1, a second resistor unit R2, and a second comparator 132.

The third transistor M3 may have a driving voltage Vdd applied to a first terminal thereof. Here, the driving voltage may also be the power supply voltage Vs provided from the power supply unit 110 described above.

The first resistor unit R1 has one end connected to a second terminal of the third transistor M3.

The second resistor unit R2 has one end connected to the other end of the first resistor unit R1 and the other end connected to a ground.

The second comparator 132 may have a non-inverting terminal connected to the other end of the first resistor unit R1 and an inverting terminal to which a common mode voltage (VCM) is applied through a common mode voltage input terminal 131.

Here, the common mode voltage maybe a band gap reference (BGR), or the like.

In addition, a voltage at the second terminal of the third transistor M3 may be the output signal, that is, the reference voltage Vref, of the reference voltage generating unit 130.

Therefore, in the case in which the power supply voltage Vs is applied to the first terminal of the third transistor M3, the power supply voltage Vs may be divided by a sum resistance value of the first and second resistor units R1 and R2 and then output as the reference voltage Vref.

In addition, a connection node between the first and second resistor units R1 and R2 is connected to the non-inverting terminal of the second comparator 132, and the common mode voltage is applied to the inverting terminal of the second comparator 132. Therefore, when a voltage applied to the non-inverting terminal of the second comparator 132 becomes lower than the common mode voltage due to a change of the power supply voltage Vs, the third transistor M3 is turned off, such that the reference voltage Vref is not output from the reference voltage generating unit 130.

Therefore, in the case in which the power supply voltage Vs is changed in excess of a predetermined range, the reference voltage Vref is not output, and in the case in which the reference voltage Vref is rapidly changed, the possibility that the reset signal generating unit 140 will malfunction may be reduced.

Figure 5:
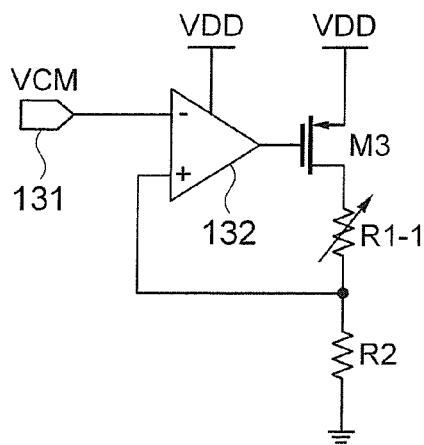
FIG. 5 is a diagram schematically showing a reference voltage generating unit of a power on reset device according to another exemplary embodiment of the present invention.
Figure 6:
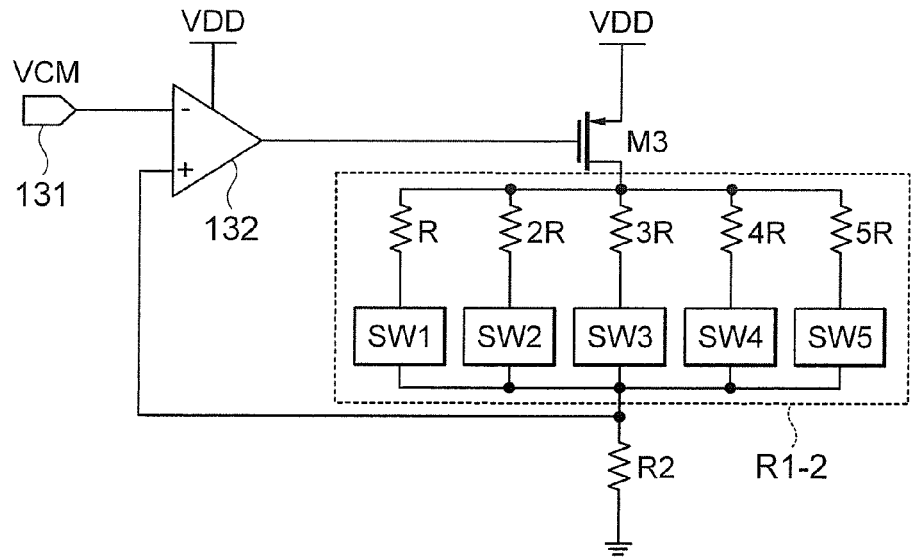
FIG. 6 is a diagram schematically showing a reference voltage generating unit of a power on reset device according to still another exemplary embodiment of the present invention.

FIG. 5 is a diagram schematically showing a reference voltage generating unit 130-1 of a power on reset device 100 according to another exemplary embodiment of the present invention; and FIG. 6 is a diagram schematically showing a reference voltage generating unit 130-2 of a power on reset device 100 according to still another exemplary embodiment of the present invention.

Referring to FIG. 5, a first resistor unit R1-1 of the reference voltage generating unit 130 may be formed of a variable resistor to allow a reference voltage Vref generated by dividing a power supply voltage Vs to be adjusted.

In addition, as shown in FIG. 5, a first resistor unit R1-1 may be implemented as a single variable resistor. However, as shown in FIG. 6, a first resistor unit R1-2 may also be implemented by connecting a plurality of resistors in parallel with each other and selectively connecting each of the resistors between a second resistor unit and a second terminal of a third transistor M3 by each of the switches.

Here, first to fifth resistors R, 2R, 3R, 4R, and 5R may have the same resistance value or different resistance values. In addition, although the case in which five resistors R, 2R, 3R, 4R, and 5R are connected to each other in parallel with each other is shown by way of example in FIG. 5, the present invention is not limited thereto.

In addition, a resistance value of the first resistor unit R1-2 may be varied according to a turn-on or turn-off operation of first to fifth switches sw1, sw2, sw3, sw4, and sw5 connected in series with the first to fifth resistors R, 2R, 3R, 4R, and 5R, respectively.

Therefore, according to the exemplary embodiment of the present invention, the resistance value of the first resistor unit R1-1 or R1-2 is changed as needed, thereby making it possible to change the reference voltage Vref that becomes a reference of brown out detection (BOD).

Therefore, in the case in which the power on reset device 100 according to the exemplary embodiment of the present invention is used in a system having a relatively poor power supply voltage Vs environment, the reference voltage Vref for performing the BOD may be set to be relatively low, and in the case in which the power on reset device 100 according to the exemplary embodiment of the present invention is used in a good power supply voltage Vs environment, the reference voltage Vref for performing the BOD may be set to be relatively high.

Therefore, stability of an apparatus or a system is improved and an unnecessary reset phenomenon is minimized, thereby making it possible to more efficiently utilize the apparatus or the system.

Figure 7A:
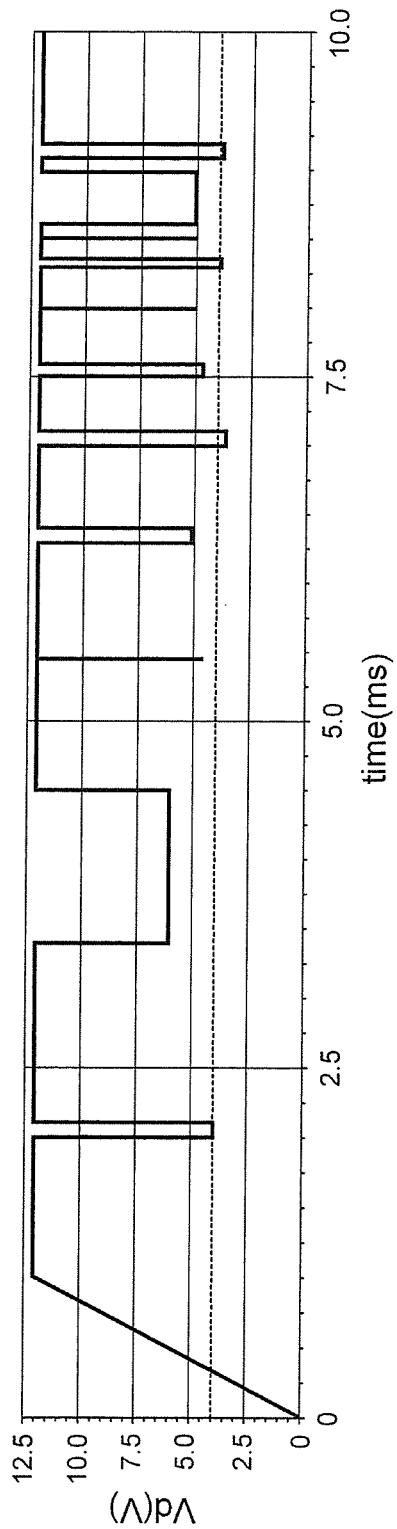
Figure 7B:
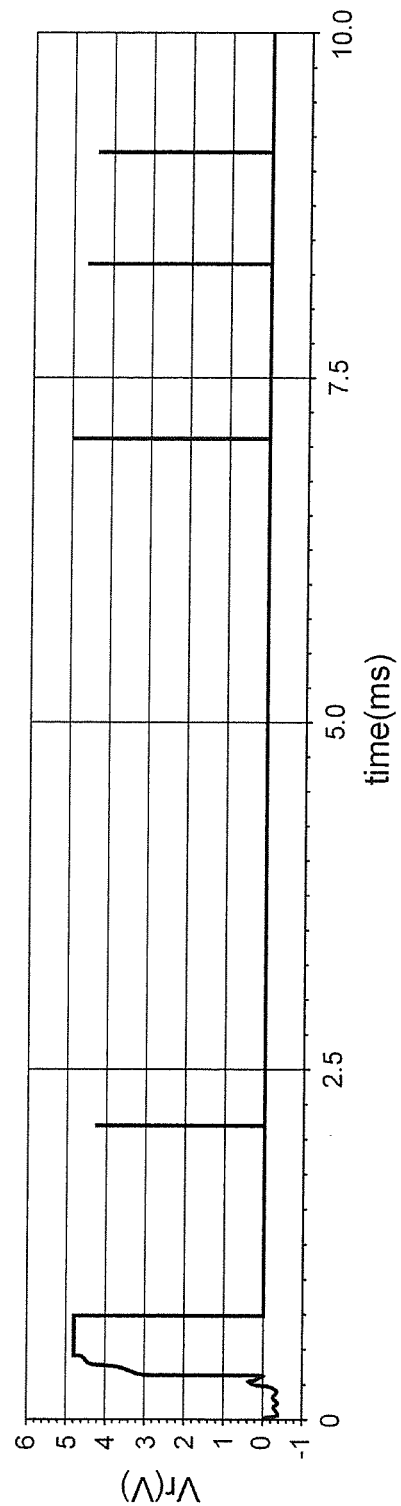

FIGS. 7A and 7B are diagrams schematically showing a relationship between input and output signals of the power on reset device 100 according to the exemplary embodiment of the present invention, wherein FIG. 7A is a graph showing a waveform of a delay signal Vd output in a delay signal generating unit 120; and FIG. 7B is a graph showing a reset signal Vr output to a reset signal output terminal 150.

Referring to FIGS. 7A and 7B, it may be understood that when a delay signal Vd, which is a signal generated by delaying a change of a power supply voltage Vs, becomes lower than a predetermined reference voltage Vref (the case in which the reference voltage Vref is 4V is shown in FIGS. 7A and 7B), a reset signal Vr corresponding to H may be generated, and in other cases, a reset signal Vr corresponding to L may be generated.

Meanwhile, a power on reset method according to the exemplary embodiment of the present invention may be implemented by generating a delay signal Vd by delaying a power supply voltage Vs and then comparing the delay signal with a predetermined reference voltage Vref to output a reset signal Vr.

Here, the reset signal Vr may be H only in the case in which the delay signal Vd is smaller than the reference voltage Vref and be L in other cases.

In addition, the reference voltage Vref may be generated through a separate process. For example, the reference voltage Vref may be generated by dividing the power supply voltage Vs in a predetermined ratio.

Further, in the case in which the power supply voltage Vs is changed in excess of a predetermined range, the reference voltage Vref may also not be output.

According to the exemplary embodiments of the present invention configured as described above, both of a POR function and a BOD function may be performed, and the BOD function may be more precisely performed as compared with the case according to the related art.

In addition, since the reference voltage that becomes the reference of the BOD may be changed as needed, in the case in which the power on reset device according to the exemplary embodiment of the present invention is used in a system having a relatively poor power supply voltage environment, the reference voltage for performing the BOD may be set to be relatively low, and in the case in which the power on reset device according to the exemplary embodiment of the present invention is used in a good power supply voltage environment, the reference voltage for performing the BOD may be set to be relatively high.

Therefore, stability of an apparatus or a system is improved and an unnecessary reset phenomenon is minimized, thereby making it possible to more efficiently utilize the apparatus or the system.

What is claimed is:

1. A power on reset (POR) device comprising:
    a power supply unit providing a power supply voltage;
    a delay signal generating unit delaying and outputting the power supply voltage provided from the power supply unit by a predetermined time; and
    a reset signal generating unit comparing a signal output from the delay signal generating unit with a predetermined reference voltage to generate a reset signal, wherein
    the delay signal generating unit includes:
        a first capacitor having the power supply voltage applied to one end thereof,
        a first no connected to the other end of the first capacitor,
        a first transistor having a first terminal connected to the first node and a second terminal connected to a ground,
        a second transistor having a first terminal connected to one end of the first capacitor and a control terminal connected to the first node,
        a second node connected to a control terminal of the first transistor and a second terminal of the second transistor, and
        a second capacitor having one end connected to the second node and the other end connected to the ground, and
    the delay signal generating unit outputs a voltage value of the second capacitor.

2. The power on reset device according to claim 1, wherein the reset signal generating unit generates the reset signal in the case in which the signal output from the delay signal generating unit is smaller than the reference voltage.

3. The power on reset device according to claim 2, wherein the reset signal generating unit includes a first comparator having a first terminal to which the signal output from the delay signal generating unit is input and a second terminal to which the reference signal is applied.

4. The power on reset device according to claim 3, wherein the reset signal generating unit further includes an inverter connected to an output terminal of the first comparator, the first terminal of the first comparator is a non-inverting, terminal, and the second terminal of the first comparator is an inverting terminal.

5. The power on reset device according to claim 1, wherein the power supply unit includes:
    an external power input terminal to which external power is input; and
    a regulator regulating the external power input through the external power input terminal.

6. The power on reset device according to claim 1, further comprising:
    a reference voltage generating unit generating a reference voltage and providing the reference voltage to the reset signal generating unit.

7. The power on reset device according to claim 6, wherein the reference voltage generating unit includes:
    a third transistor having the power supply voltage applied to a first terminal thereof;
    a first resistor unit having one end connected to a second terminal of the third transistor;
    a second resistor unit having one end connected to the other end of the first resistor unit and the other end connected to a ground; and
    a second comparator having a first terminal connected to the other end of the first resistor unit, a second terminal to which a common mode voltage (VCM) is applied, and an output terminal connected to a control terminal of the third transistor, and the reference voltage generating unit has an output terminal connected to the second terminal of the third transistor.

8. The power on reset device according to claim 7, wherein the first resistor unit is a variable resistor.

9. The power on reset device according to claim 7, wherein the first resistor unit includes:
    a first resistor having one end connected to the second terminal of the third transistor;
    a first switch having one end connected to the other end of the first resistor and the other end provided at one end of the second resistor unit to thereby be turned on or turned off;
    a second resistor having one end connected to the second terminal of the third transistor; and
    a second switch having one end connected to the other end of the second resistor and the other end provided at one end of the second resistor unit to thereby be turned on or turned off, and
    the first resistor unit has a resistance value varied by a turn on or turn off operation of the first and second switches.

10. The power on reset device according to claim 7, wherein the reset signal generating unit generates the reset signal in the case in which the signal output from the delay signal venerating unit is smaller than the reference voltage.

11. The power on reset device according to claim 10, wherein the reset signal generating unit includes a first comparator having a first terminal to which the signal output from the delay signal generating unit is input and a second terminal to which the reference signal is input.

12. The power on reset device according to claim 11, wherein the reset signal generating unit further includes an inverter connected to an output terminal of the first comparator, the first terminal of the first comparator is a non-inverting terminal, and the second terminal of the first comparator is an inverting terminal.

13. The power on reset device according to claim 7, wherein the power supply unit includes:
    an external power input terminal to which external power is input; and
    a regulator regulating the external power input through the external power input terminal.

* * * * *